United States Patent
Schäfer et al.

(10) Patent No.: US 6,690,605 B2
(45) Date of Patent: Feb. 10, 2004

(54) LOGIC SIGNAL LEVEL CONVERTER CIRCUIT AND MEMORY DATA OUTPUT BUFFER USING THE SAME

(75) Inventors: Andre Schäfer, München (DE); Joachim Schnabel, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/410,383

(22) Filed: Apr. 9, 2003

(65) Prior Publication Data
US 2003/0189477 A1 Oct. 9, 2003

(30) Foreign Application Priority Data
Apr. 9, 2002 (DE) .......................................... 102 15 546

(51) Int. Cl.[7] ................................................. G11C 7/10
(52) U.S. Cl. ............................. 365/189.11; 365/189.08; 365/189.05; 365/190; 365/233; 365/228
(58) Field of Search ....................... 365/189.11, 189.05, 365/189.08, 190, 193, 228, 226, 233; 326/28, 27, 26, 81, 80

(56) References Cited

U.S. PATENT DOCUMENTS

| | | | |
|---|---|---|---|
| 5,900,750 A | * | 5/1999 | Schmitt ...................... 327/108 |
| 6,166,969 A | | 12/2000 | Song et al. ............. 365/189.11 |
| 6,304,069 B1 | | 10/2001 | Tatsumi ...................... 323/312 |
| 6,411,127 B2 | * | 6/2002 | Lee ............................ 326/83 |
| 6,501,306 B1 | * | 12/2002 | Kim et al. ................... 327/112 |

\* cited by examiner

Primary Examiner—Andrew Q. Tran
(74) Attorney, Agent, or Firm—Laurence A. Greenberg; Werner H. Stemer; Gregory L. Mayback

(57) ABSTRACT

A circuit configuration for converting logic signal levels has two level converters, to which an input signal to be converted is fed complementarily. The level converters generate a rising or falling edge with a different gradient. The output signals of the level converters are combined in a logic combination element. The logic combination element drives a togglable storage element, which provides the level-converted output signal. The duty ratio of the input signal is not changed during the level conversion, independently of production-dictated variations in the component parameters.

9 Claims, 2 Drawing Sheets

LOGIC SIGNAL LEVEL CONVERTER CIRCUIT AND MEMORY DATA OUTPUT BUFFER USING THE SAME

BACKGROUND OF THE INVENTION

Field of the Invention

The invention relates to a circuit configuration for converting logic signal levels from an input signal to an output signal. In addition, the invention relates to a use of such a circuit configuration in a semiconductor memory.

Such signal level converters are often used in electronic circuits in order to level-convert logic signal levels from a circuit region supplied by a first supply voltage and to forward them to a circuit region supplied by another supply voltage. One application of such circuits is in dynamic random access memories (DRAMs), where the circuit regions within the semiconductor memory and, in comparison therewith, the circuit regions disposed directly on the output side are supplied by different supply voltage bus bars. The supply voltage for the inner circuit regions is usually lower than that for the outer circuit regions.

A fundamental requirement made of such a signal level converter is that the signal is as far as possible not delayed and a high operating frequency can be complied with and, moreover, that the signal characteristics in particular the steepness of rising and falling edges, are as far as possible not changed. In this case, it is also the intention that the duty ratio of the logic signal to be converted, that is to say the ratio between high and low phases of the signal, is as far as possible not changed during the conversion.

A conventional level converter embodied in present-day customary CMOS circuit technology has two cross-coupled current paths with series-connected p-channel and n-channel field-effect transistors. Since the signal level swing differs at the input and at the output, by way of example the high level being present at the positive pole of the inner supply voltage on the input side and at the positive pole of the outer supply voltage on the output side, it has proved to be favorable to confer different dimensioning on the driver capability of the n-channel and p-channel field-effect transistors of a current path in such a level converter. In this case, the n-channel field-effect transistor, connected to a reference-ground potential or ground, is to be provided with a higher current driver capability than the p-channel field-effect transistor, connected to the positive supply potential. What is thereby achieved is that, even in the event of different operating conditions, the level converter switches sufficiently reliably and does not, for instance, remain in a floating state.

The different dimensioning of p-channel and n-channel field-effect transistors in the conventional level converter has the disadvantage that a rising edge and a falling edge of a logic signal to be converted are converted differently. The gradient of a rising edge is shallower than the gradient of a falling edge. As a result, the duty ratio of a signal to be converted is changed by the conventional level converter during the signal conversion. This effect could be compensated for by compensatory circuit measures, so that the digital signal is still identified sufficiently reliably by downstream circuits.

What is problematic, however, is that, as is known, the parameters of transistors in integrated circuits are subject to not inconsiderable fluctuations. The aforementioned effect of distortion of the duty ratio may thus be subject to corresponding fluctuations between different integrated semiconductor modules, so that the functionality of the integrated circuit is jeopardized in the unfavorable case. In order to provide a remedy, additional transistors that can optionally be connected in after production and testing have been necessary hitherto in order to provide for compensation. This necessitates additional outlay in the production and testing of the semiconductor circuit.

SUMMARY OF THE INVENTION

It is accordingly an object of the invention to provide a circuit configuration for converting logic signal levels that overcomes the above-mentioned disadvantages of the prior art devices of this general type, which has a reliable circuit behavior and requires less outlay in its production.

With the foregoing and other objects in view there is provided, in accordance with the invention, a circuit configuration for converting logic signal levels. The circuit configuration contains an input terminal for receiving an input signal to be converted, and level converters, including a first level converter and a second level converter each having an input receiving the input signal in a complementarily fashion with respect to each other. Each of the level converters further contains an output, and two current paths, including a first current path and a second current path. The current paths each have two series-connected transistors of complementary conductivity types and the transistors have control terminals. The transistors of the same conductivity type of different ones of the current paths being controlled complementarily with respect to one another and the transistors of a respective same one of the current paths being controlled complementarily with respect to one another. A logic combination element has an output and inputs coupled to the output of each of the level converters. A togglable storage element has an output and an input connected to the output of the logic combination element. An output terminal is connected to the output of the togglable storage element.

Such a circuit configuration is used in a read data signal path of a semiconductor memory module for converting a data signal read from a memory cell to an output driver, which is connected to a terminal for providing a data signal outside the semiconductor memory.

The circuit configuration according to the invention provides two level converters whose output signals are combined with one another in order subsequently to drive a togglable storage element. From a functional standpoint, the level converters only provide the information that an edge of the input signal has occurred. The temporal succession of the information about the occurrence of an edge is forwarded to the togglable storage element and used there again for forming the output signal. The edge steepness of a rising or falling edge is determined by the dimensioning of the components in the togglable storage element on the output side. Since the converted signal levels are already present there and all the circuit sections and signal levels are already present at the level of the outer supply voltage on the output side or of the signal level swing on the output side, it is possible to use conventional inverters. These inverters are dimensioned as usual such that they generate rising and falling edges with rise and fall rates, respectively, that are identical in magnitude. What is thereby achieved overall is that the converted logic signal, on the output side, again has the duty ratio corresponding to the input signal.

In the circuit configuration according to the invention, all the circuit elements connected upstream of the two level converters are supplied by the lower inner supply voltage of the level converter. All the functional elements connected downstream of the level converters are supplied by the higher output-side supply voltage of the level converter. Thus, a respective inverter is additionally provided between the outputs of the level converters and the input of the logic combination element, the inverter being supplied by the output-side supply voltage.

The level converters have current paths with field-effect transistors of complementary channel types that are connected in series with respect to their drain-source paths. The transistors of a current path and transistors of the same channel type of different current paths are controlled complementarily with respect to one another.

These current paths are supplied by the output-side supply voltage. An inverter connected between the n-channel field-effect transistors of the different current paths, the transistors being connected to reference-ground potential, is still supplied by the input-side supply voltage. The inverter is connected between the gate terminals of the n-channel field-effect transistors.

The logic combination element is expediently a NAND gate. The NAND gate generates a low level on the output side only if two high levels are fed to it on the input side. This is the case in the circuit configuration when one of the level converters has already converted a falling edge while the rising edge, on account of the lower rise rate, has not yet risen to a sufficiently high signal level that the switching threshold value of the subsequent circuits has been reached. The information about the duty ratio of the signal to be converted is now present in the falling edge of the signal at the output of the NAND gate. The togglable storage element connected downstream is switched with the falling edge and generates rising and falling edges of the output signal alternately in succession.

In accordance with an added feature of the invention, a second inverter has an input connected to the input terminal and an output connected to the input of the first level converter. A transfer gate is provided and has an input connected to the input terminal and an output connected to the input of the second level converter.

In accordance with an additional feature of the invention, third inverters are provided and each has an input and an output. In each of the level converters, one set of the transistors being two transistors of the same conductivity type includes a first transistor connected to the input of a respective third inverter and a second transistor connected to the output of the respective third inverter, such that the control terminals of the first and second transistors are connected to each other through the respective third inverter.

In accordance with another feature of the invention, the second inverter and the third inverters of the level converters have supply voltage terminals for receiving a first supply voltage. The current paths, the logic combination element, the togglable storage element, and the first inverters in each case have terminals for receiving a second supply voltage. The second supply voltage is higher than the first supply voltage.

In accordance with a concomitant feature of the invention, in each of the level converters, each of the current paths has an n-channel field-effect transistor with a source-drain path and a gate terminal and a p-channel field-effect transistor with a gate terminal and a drain-source path connected in series with the source-drain path of the n-channel field-effect transistor at a coupling node. The gate terminal of the n-channel field-effect transistor of the first current path is coupled to the input terminal. Each of the level converters has an inverter with an input connected to the gate terminal of the n-channel field-effect transistor of the first current path and an output connected to the gate terminal of the n-channel field-effect transistor of the second current path. In each of the level converters, the coupling node of the transistors of the first current path is connected to the gate terminal of the p-channel field-effect transistor of the second current path and to the output of the level converter. In each of the level converters, the coupling node of the transistors of the second current path is connected to the gate terminal of the p-channel transistor of the first current path.

Other features which are considered as characteristic for the invention are set forth in the appended claims.

Although the invention is illustrated and described herein as embodied in a circuit configuration for converting logic signal levels, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
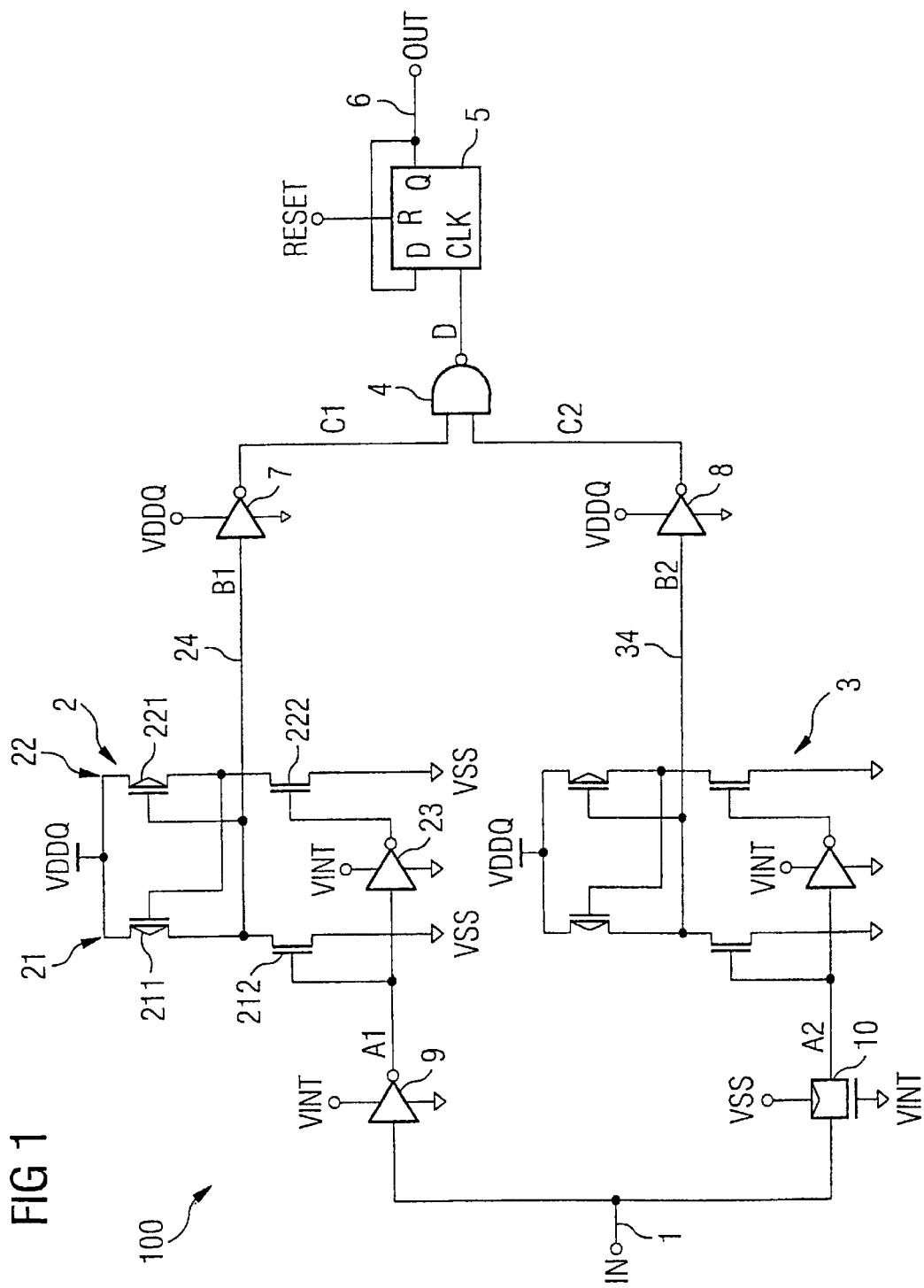
FIG. 1 is a circuit diagram of a circuit configuration for converting signal levels according to the invention.

Referring now to the figures of the drawing in detail and first, particularly, to FIG. 1 thereof, there is shown a digital input signal IN that is fed to a circuit configuration at an input terminal 1. The low level of the input signal IN is at a reference-ground potential or ground VSS. The high level is at a positive pole VINT of the supply voltage supplied by upstream circuits that provide the input signal IN. On the output side, an output signal OUT that has been converted in terms of its level swing can be tapped off at the output terminal 6. The low level of the output signal is at ground VSS, and the high level of the output signal is at the positive pole VDDQ of the supply voltage of the circuits connected downstream. In practice, at the present time a voltage of 1.8 to 2.5 volts is provided for the supply voltage VDDQ with respect to ground VSS. The internal supply voltage VINT is usually somewhat less than that, for example 1.8 volts.

The circuit elements described below serve for converting the input signal IN to the output signal OUT. The input signal is fed in parallel to two signal paths. In the signal path illustrated at the top in FIG. 1, the signal IN is inverted in an inverter 9 and converted to the level swing VSS, VDDQ in a level converter 2. In the signal path illustrated at the bottom in FIG. 1, the input signal IN is forwarded via a transfer gate 10 in a non-inverted fashion to a level converter 3. The inverter 9 and the transfer gate 10 have mutually corresponding, largely identical signal propagation times. The inverter 9 is supplied by the internal supply voltage VINT. The transfer gate 10 is turned on by an n-channel field-effect transistor being turned on by the supply voltage VINT and a p-channel field-effect transistor being turned on by ground potential VSS.

The two level converters 2, 3 are of the same type of construction, in the present case of identical construction. The level converter 2 is described in detail. The level converter 2 has two current paths 21, 22 connected between terminals for ground potential VSS and the positive pole of the output-side supply voltage VDDQ. Each of the current paths has n-channel and p-channel field-effect transistors 212, 211 and 222, 221, respectively, which are connected in series by their drain-source paths. The n-channel field-effect transistors are connected to the reference-ground potential VSS, and the p-channel field-effect transistors are connected to the potential VDDQ. The coupling node of the drain terminals of the transistors 212, 211 serves as an output 24 of the level converter. The output 24 controls the p-channel field-effect transistor 221. The coupling node of the drain terminals of the transistors 222, 221 is fed back to the gate terminal of the p-channel field-effect transistor 211. The gate terminals of the n-channel field-effect transistor 212, 222 are controlled in opposite senses with respect to one another. The transistor 212 is driven directly by the output of the inverter 9, and the gate terminal of the transistor 222 is additionally driven via an inverter 23. The gate terminals of the transistors 212, 222 are thus connected to one another through the inverter 23. The inverter 23 is supplied by the positive pole of the VINT of the internal supply voltage.

If, by way of example, the input signal IN has a rising edge 213 (see FIG. 2), a signal A1 driving the level converter 2 has a falling edge 214, so that the transistor 212 is turned off and the transistor 222 is turned on. The gate terminal of the transistor 211 is thus pulled to the ground potential VSS, so that the transistor 211 is turned on and the output 24 is pulled to the high potential VDDQ. The transistor 221 is thus switched off. The level converter 2 has now attained the stable state again. In order that the circuit switches reliably even in the event of different relations between the potentials VINT, VDDQ, the p-channel field-effect transistors 211, 221 are dimensioned with a smaller current driver capability than the n-channel field-effect transistors 212, 222. The edge of a rising level at the output 24 thus has the relatively shallow profile, as can be discerned from the profile of the signal B1 illustrated in FIG. 2.

By contrast, the level converter 3 is driven by a positive edge 215 of the signal A2. The output-side falling edge of the signal B2 has a significantly steeper profile than the output-side rising edge of the signal B1 (see FIG. 2).

The signals B1, B2 are fed to respective inverters 7, 8. The inverters 7, 8 and all the downstream circuits are supplied by the positive pole VDDQ of the output-side supply voltage. The p-channel and n-channel field-effect transistors of the inverters 7, 8 are expediently dimensioned with a different current driver capability.

Figure 2:
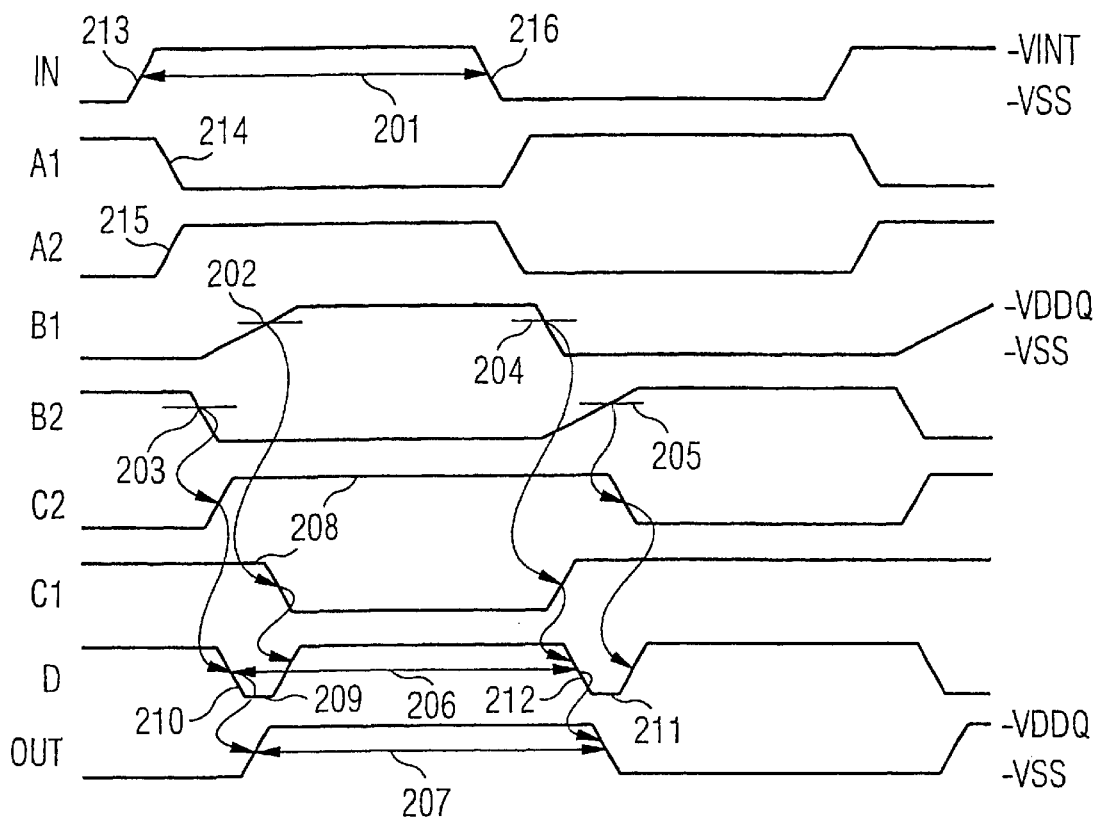
FIG. 2 is a signal diagram showing signals occurring in the circuit configuration shown in FIG. 1.

The output signals C1 and C2 respectively generated by the inverters 7, 8 are illustrated in FIG. 2. The switching thresholds of the inverters 7, 8 are entered with 202 and 203, respectively, in FIG. 2. The signals C1, C2 are combined with one another in a NAND gate 4. The NAND gate 4 is also supplied by the pole VDDQ of the output-side supply voltage. The NAND gate 4 generates a low level if, on the input side the signals C1, C2 in each case have a high level in temporally overlapping fashion. In the described example of a rising edge of the input signal IN, on account of the different switching times of the level converters 2, 3 for the rising and falling edges, two temporally overlapping high levels of the signals C1, C2 are briefly present during the time segment 208. During this phase, an output pulse 209 of the signal D is generated at the output of the NAND gate 4. A first falling edge 210 of the pulse 209 is caused by the fact that the level converter 3 provides a falling edge of the signal B2 more rapidly than the level converter 2 provides a rising edge of the signal B1. The rising edge of the pulse 209 is caused by the fact that the rising edge of the signal B1 generated by the level converter 2 has then risen to such an extent that the inverter 7 is switched.

The output signal D is fed to a togglable storage element 5 at its clock input CLK. The toggle flip-flop 5 is a D-type flip-flop whose output Q is fed back to its input D. The toggle flip-flop 5 can expediently be initialized by a reset signal RESET. The output 6 of the circuit configuration is connected to the output Q of the toggle flip-flop 5. The toggle flip-flop 5 switches over in each case into its opposite state if a falling edge is identified at its clock input CLK. With reference to FIG. 2, the output signal OUT, after initial initialization by the signal RESET, switches over to a high level with the falling edge 210 of the pulse 209 of the signal D.

If the input signal IN has a falling edge 216, the relationships now described in connection with the level converter 2 and the inverter 7 occur at the level converter 3 and the inverter 8, and vice versa. On account of the different fall and rise times for falling and rising edges, respectively, at the level converters 2, 3, a pulse 211 with a low level in the output signal D is generated at the output of the NAND gate 4. The falling edge 212 of the pulse 211 again switches the toggle flip-flop 5 into its complementary state.

If the signal propagation in the circuit of FIG. 1 is considered, then a switching operation in the toggle flip-flop 5 is triggered in each case by a falling edge of the output signal of the level converters 2, 3. This respective falling edge is triggered directly by the rising or falling edge of the input signal IN. It emerges as a consequence of this that the distance 201 between two edges of the input signal IN is transferred unchanged into the distance 206 between two falling edges of the signal D. The distance 206 is transferred unchanged to a combination of rising and falling edges of the output signal OUT, which is provided with the reference symbol 207 in the example shown in FIG. 2.

The circuit illustrated in FIG. 1 has the effect that rising and falling edges are generated by the level converters with a different gradient. Therefore, in the level converters 2, 3 it is really desirable for the level converters to be dimensioned asymmetrically with regard to the transfer of edges. It is advantageous that the p-channel field-effect transistors of the level converters 2, 3 are dimensioned with a lower current driver capability than the n-channel field-effect transistors connected in series therewith. Production-process-dictated fluctuations in the component parameters and the current driver capability of p-channel and n-channel field-effect transistors do not influence the transfer of the duty ratio in a disadvantageous manner in the case of the invention. On the contrary, a greatly different current driver capability of p-channel field-effect transistors and n-channel field-effect transistors in the level converters 2, 3 and—brought about as a result—different gradients for the generation of rising and falling edges are advantageous for the invention. Moreover, the expediently differently dimensioned current driver capability of the p and n-channel field-effect transistors of the inverters 7, 8 widens the pulse 209 and 211, respectively, so that the functional reliability is additionally increased.

Figure 3:
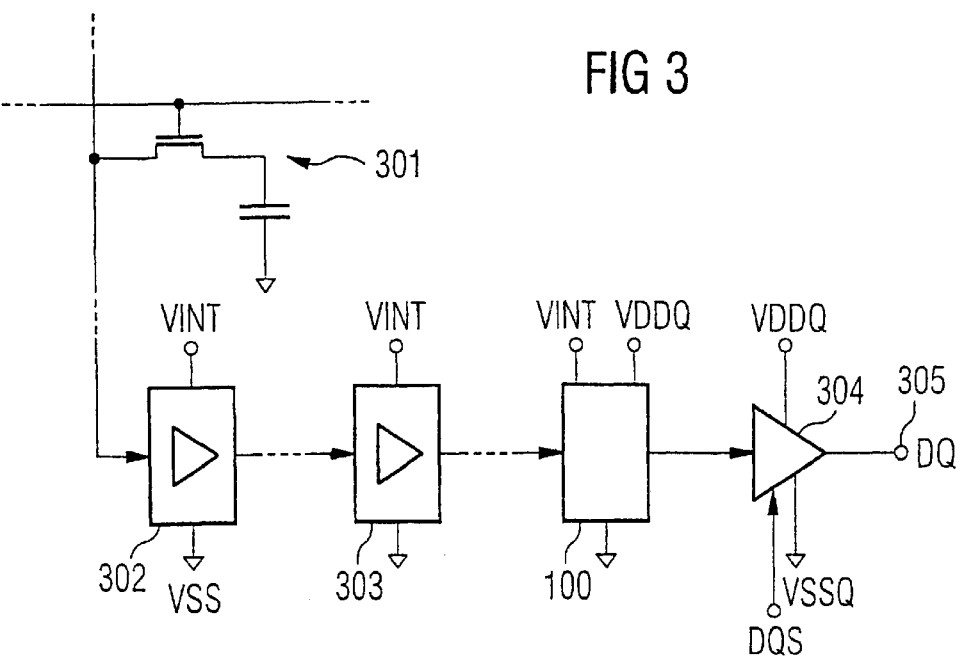
FIG. 3 is a circuit diagram showing an application of the circuit configuration in a read-out data signal path of a dynamic semiconductor memory.

The circuit illustrated in FIG. 1 can be used particularly advantageously in a dynamic semiconductor memory of present-day architecture, for example an SDRAM or a DDR SDRAM. In that case, as illustrated in FIG. 3, the internal functional units are supplied with the internal, lower supply voltage VINT, and the external circuits are supplied with the higher supply voltage VDDQ. In-between, for converting the signal levels to be transferred, the signal level converter 100 illustrated in FIG. 1 is provided in a signal path for reading out data values. By way of example, a data value is read from a memory cell 301 and amplified by primary sense amplifiers 302 and secondary sense amplifiers 303 in the data signal path. The sense amplifiers 302, 303 are supplied with the positive pole VINT of the internal supply voltage related to ground VSS. The sense amplifiers 302, 303 and, if appropriate, further functional units are connected upstream of the level conversion circuit 100. The output signal of the circuit 100 is fed directly to the so-called off chip driver 304. The latter is supplied with the positive pole VDDQ of the external supply voltage related to VSSQ. Under the control of a data strobe signal DQS, the off chip driver 304 provides the read-out data value as output data signal DQ at an output terminal 305 of the dynamic semiconductor memory for further processing external to the memory.

We claim:

1. A circuit configuration for converting logic signal levels, comprising:
    an input terminal for receiving an input signal to be converted;
    level converters, including a first level converter and a second level converter each having an input receiving the input signal in a complementarily fashion with respect to each other, each of said level converters further containing:
        an output; and
        two current paths, including a first current path and a second current path, said current paths each having two series-connected transistors of complementary conductivity types and said transistors having control terminals, said transistors of a same conductivity type of different one of said current paths being controlled complementarily with respect to one another and said transistors of a respective same one of said current paths being controlled complementarily with respect to one another;
    a logic combination element having an output and inputs coupled to said output of each of said level converters;
    a togglable storage element having an output and an input connected to said output of said logic combination element; and
    an output terminal connected to said output of said togglable storage element.

2. The circuit configuration according to claim 1, further comprising:
    first inverters, each one of said first inverters connected between said output of one of said level converters and one of said inputs of said logic combination element.

3. The circuit configuration according to claim 2, further comprising:
    a second inverter having an input connected to said input terminal and an output connected to said input of said first level converter; and
    a transfer gate having an input connected to said input terminal and an output connected to said input of said second level converter.

4. The circuit configuration according to claim 3,
    further comprising third inverters each having an input and an output; and
    wherein in each of said level converters, one set of said transistors being two transistors of said same conductivity type includes a first transistor connected to said input of a respective third inverter and a second transistor connected to said output of said respective third inverter, such that said control terminals of said first and second transistors are connected to each other through said respective third inverter.

5. The circuit configuration according to claim 4, wherein:
    said second inverter and said third inverters of said level converters have supply voltage terminals for receiving a first supply voltage; and
    said current paths, said logic combination element, said toggable storage element, and said first inverters in each case have terminals for receiving a second supply voltage, the second supply voltage being higher than the first supply voltage.

6. The circuit configuration according to claim 1, wherein said logic combination element is a NAND gate.

7. The circuit configuration according to claim 1, wherein said togglable storage element has a clock input connected to said output of said logic combination element, said togglable storage element changing a switching state with each clock pulse.

8. The circuit configuration according to claim 1, wherein:
    in each of said level converters, each of said current paths has an n-channel field-effect transistor with a source-drain path and a gate terminal and a p-channel field-effect transistor with a gate terminal and a drain-source path connected in series with said source-drain path of said n-channel field-effect transistor at a coupling node, said gate terminal of said n-channel field-effect transistor of said first current path is coupled to said input terminal;
    each of said level converters having an inverter with an input connected to said gate terminal of said n-channel field-effect transistor of said first current path and an output connected to said gate terminal of said n-channel field-effect transistor of said second current path;
    in each of said level converters, said coupling node of said transistors of said first current path is connected to said gate terminal of said p-channel field-effect transistor of said second current path and to said output of said level converter; and
    in each of said level converters, said coupling node of said transistors of said second current path is connected to said gate terminal of said p-channel transistor of said first current path.

9. A memory configuration, comprising:
    a memory cell;
    a terminal for providing a data signal outside the memory configuration;
    an output driver connected to said terminal;
    a circuit configuration for converting logic signal levels connected between said memory cell and said output driver, said circuit configuration containing:
        an input terminal coupled to said memory cell for receiving an input signal to be converted from said memory cell;
        level converters, including a first level converter and a second level converter each having an input receiving the input signal in a complementarily fashion with respect to each other, each of said level converters further including:
            an output; and
            two current paths, including a first current path and a second current path, said current paths each having two series-connected transistors of complementary conductivity types and said transistors having control terminals, said transistors of a same conductivity type of different ones of said current paths being controlled complementarily with respect to one another and said transistors of a respective same one of said current paths being controlled complementarily with respect to one another;
        a logic combination element having an output and inputs coupled to said output of each of said level converters;
        a togglable storage element having an output and an input connected to said output of the logic combination element; and
        an output terminal connected between said output of said togglable storage element and said output driver.

* * * * *